(12) United States Patent
Wang

(10) Patent No.: US 12,733,393 B2
(45) Date of Patent: Sep. 8, 2026

(54) LIGHT-EMITTING DEVICE AND MANUFACTURING METHOD THEREFOR, AND DISPLAY PANEL

(71) Applicant: TCL TECHNOLOGY GROUP CORPORATION, Huizhou (CN)

(72) Inventor: Tianfeng Wang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 441 days.

(21) Appl. No.: 18/557,930

(22) PCT Filed: Dec. 31, 2021

(86) PCT No.: PCT/CN2021/143598

§ 371 (c)(1),
(2) Date: Oct. 28, 2023

(87) PCT Pub. No.: WO2022/227680

PCT Pub. Date: Nov. 3, 2022

(65) Prior Publication Data

US 2025/0268017 A1 Aug. 21, 2025

(30) Foreign Application Priority Data

Apr. 26, 2021 (CN) ......................... 202110455293.2

(51) Int. Cl.

| | |
|---|---|
| ***H10K 85/50*** | (2023.01) |
| ***H10K 50/115*** | (2023.01) |
| ***H10K 50/16*** | (2023.01) |
| ***H10K 50/165*** | (2023.01) |
| ***H10K 59/10*** | (2023.01) |
| ***H10K 71/40*** | (2023.01) |

(52) U.S. Cl.
CPC .......... *H10K 85/50* (2023.02); *H10K 50/115* (2023.02); *H10K 50/165* (2023.02);
(Continued)

(58) Field of Classification Search
CPC .... H10K 85/50; H10K 50/115; H10K 50/165; H10K 50/166; H10K 59/10;
(Continued)

(56) References Cited

U.S. PATENT DOCUMENTS 12,058,930 B2 * 8/2024 Masuda ............... H10K 85/654
2021/0119161 A1 * 4/2021 Han .................... H10K 50/165
(Continued)

FOREIGN PATENT DOCUMENTS

CN 108539034 A * 9/2018 .......... H10K 50/166
CN 108550614 A * 9/2018 .......... H10K 50/165
(Continued)

OTHER PUBLICATIONS

International Search Report in International application No. PCT/CN2021/143598,mailed on Mar. 29, 2022.
(Continued)

*Primary Examiner* — Earl N Taylor
(74) *Attorney, Agent, or Firm* — Nathan & Associates Patent Agents Ltd.; Menachem Nathan

(57) ABSTRACT

Disclosed in the present application are a light-emitting device and a manufacturing method therefor, and a display panel. The manufacturing method for a light-emitting device comprises the following steps: providing a first device plate; coating the first device plate with a metal oxide mixed solution; performing first annealing treatment on the metal oxide mixed solution at a first preset temperature; performing secondary annealing treatment on the metal oxide mixed solution at a second preset temperature; and forming a second device plate on a surface of a second electron transport layer that is away from a first electron transport layer.

18 Claims, 3 Drawing Sheets

(52) U.S. Cl.
CPC ........... *H10K 50/166* (2023.02); *H10K 59/10* (2023.02); *H10K 71/441* (2023.02)

(58) Field of Classification Search
CPC .. H10K 71/441; H10K 71/40; H10K 2102/00; H10K 50/00; H10K 71/00; H10K 85/00; H01L 51/56; H01L 2251/303; H01L 51/50; H01L 51/508; H01L 51/502; H01L 51/0032; H01L 51/0026; H10P 14/2918; H10P 14/3234; H10P 14/3251; H10P 14/3434; H10P 14/38; H10P 14/265
See application file for complete search history.

(56) References Cited

U.S. PATENT DOCUMENTS

| | | | | |
|---|---|---|---|---|
| 2021/0242417 | A1* | 8/2021 | Sykes | H10K 30/85 |
| 2021/0296603 | A1* | 9/2021 | Arai | G06F 3/03543 |
| 2022/0069246 | A1* | 3/2022 | Seo | H10K 50/16 |
| 2022/0123060 | A1* | 4/2022 | Kang | H10K 59/35 |
| 2023/0047894 | A1* | 2/2023 | Shirasaki | H10K 50/16 |
| 2023/0146966 | A1* | 5/2023 | Tanaka | H10K 59/1213<br>257/40 |
| 2024/0016018 | A1* | 1/2024 | Hou | H10K 59/875 |

FOREIGN PATENT DOCUMENTS

| | | | |
|---|---|---|---|
| CN | 109728179 | A | 5/2019 |
| CN | 109962179 | A | 7/2019 |
| CN | 111653678 | A | 9/2020 |
| CN | 112151648 | A | 12/2020 |
| WO | 2020108071 | A1 | 6/2020 |

OTHER PUBLICATIONS

Written Opinion of the International Search Authority in International application No. PCT/CN2021/143598,mailed on Mar. 29, 2022.

* cited by examiner

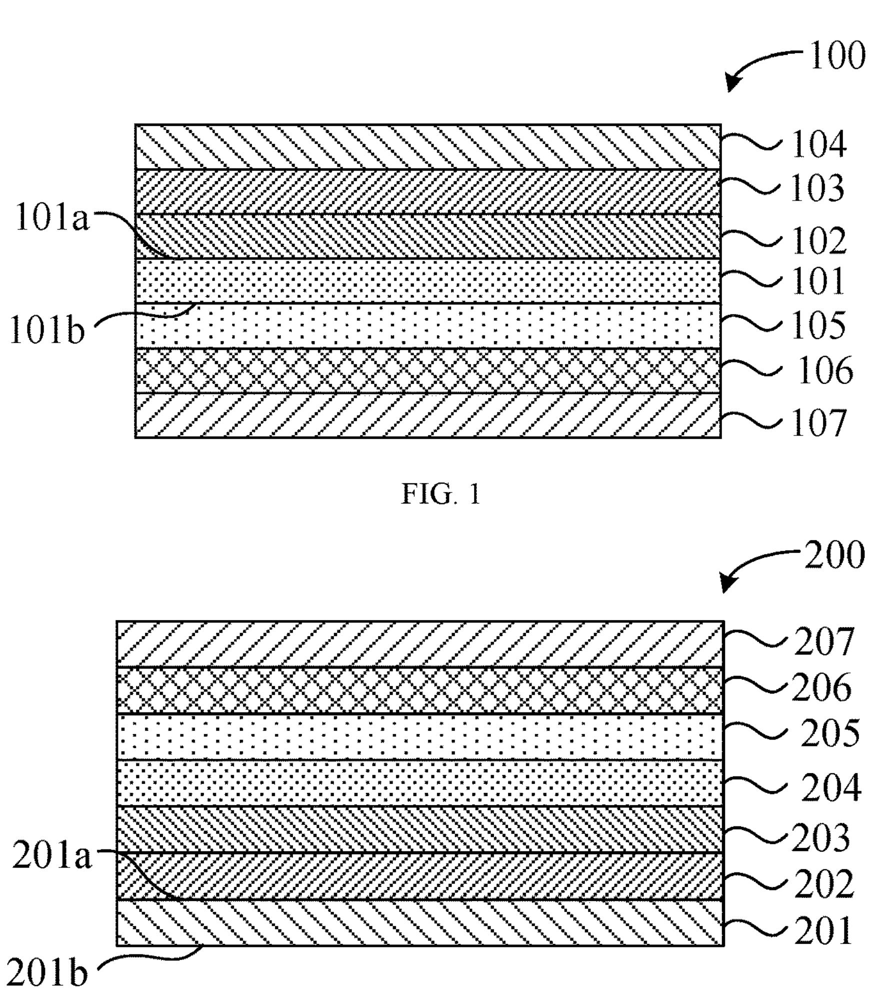
FIG. 1
FIG. 2
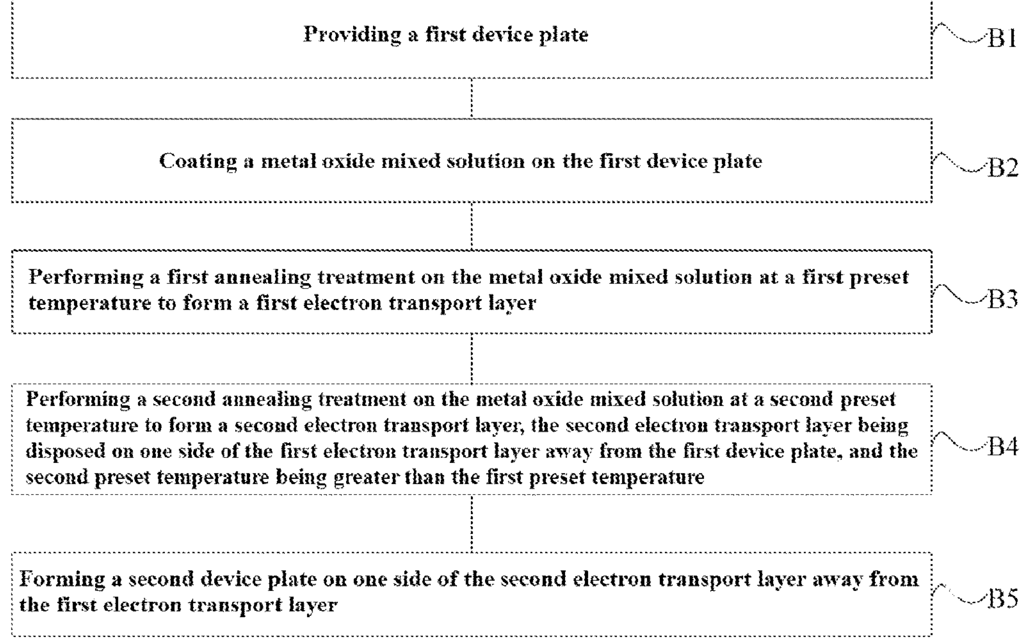
FIG. 3

LIGHT-EMITTING DEVICE AND MANUFACTURING METHOD THEREFOR, AND DISPLAY PANEL

PRIORITY

The present disclosure claims priority to Chinese Patent Application No. 202110455293.2, filed on Apr. 26, 2021, and entitled "light-emitting device and manufacturing method therefor, and display panel", the disclosure of which is incorporated herein by reference in its entirety.

TECHNICAL FIELD

The present disclosure relates to the field of display technologies, and in particular, to a light-emitting device and a manufacturing method thereof, and a display panel.

BACKGROUND

Quantum dots are nanocrystalline particles with a radius less than or close to the Boltz excimer radius and typically have a particle size between 1 nm and 10 nm. Quantum dots have a quantum confinement effect and can emit fluorescence after being excited. Moreover, quantum dots have unique luminescence properties such as wide excitation peak width, narrow emission peak and tunable luminescence spectrum, so that they have a wide application prospect in the field of photo-luminescence. Quantum dot light-emitting diodes (QLED) are devices in which colloidal quantum dots are used as a light-emitting layer. A quantum dot light-emitting layer is introduced between different conductive materials to obtain light of a desired wavelength. Quantum dot light-emitting diodes have advantages of large color gamut, self-luminousness, low starting voltage, fast response, and so on.

Quantum dots can adjust the band gap by adjusting the size and composition of the nanoparticles to obtain different (such as red, blue, and green) luminescence properties.

In QLED devices, metal-oxide nanoparticles with high mobility and their doped materials are currently commonly used in the electron transport layer. Ag, Al and their doped materials or a composite layer are cathode materials commonly used.

However, at present, there are problems in the functional layer of printed display devices: a work function of a commonly used cathode material is quite different from a conduction band energy level of quantum dots, which results in a large potential barrier, so that electron injection is affected, thus causing charge accumulation, and reducing the efficiency and lifetime of the devices. The existing solution is usually to form an electron transport layer with stepped energy levels by preparing multiple layers of differently doped metal oxides, so as to reduce the injection barrier and improve device performance. However, in a printed display device, metal oxide needs to subject to multiple times of printing by using the conventional method, which increases the process of the electron transport layer, resulting in increased production costs and reduced product yields.

SUMMARY OF INVENTION

Technical Problems

The present disclosure provides a light-emitting device and a manufacturing method thereof, and a display panel, which are used to solve the problem of cumbersome manufacturing steps of an electron transport layer in the light-emitting device.

SOLUTIONS TO THE PROBLEMS

Technical Solutions

An embodiment of the present disclosure provides a method for manufacturing a light-emitting device, including the steps of:

- providing a first device plate;
- coating a metal oxide mixed solution on the first device plate;
- performing a first annealing treatment on the metal oxide mixed solution at a first preset temperature to form a first electron transport layer;
- performing a second annealing treatment on the metal oxide mixed solution at a second preset temperature to form a second electron transport layer, wherein the second electron transport layer is disposed on one side of the first electron transport layer away from the first device plate, and the second preset temperature is greater than the first preset temperature; and
- forming a second device plate on one side of the second electron transport layer away from the first electron transport layer.

In the method of manufacturing a light-emitting device according to an embodiment of the present disclosure, before the step of coating a metal oxide mixed solution on the first device plate, the method further includes:

- forming a doped metal oxide by doping a first metal oxide with a metal element including at least one of magnesium and aluminum, wherein a mole percentage of the metal element to the first metal oxide is between 5% and 20%;
- forming a coordination metal compound by adding a ligand to a second metal oxide, the ligand being selected from the group consisting of thiols, alcohol amines, and polyhydroxy ethers, wherein a mole percentage of the ligand to the second metal oxide is between 0.1% and 10% in case that the ligand is selected from the thiols or the alcohol amines, and a mole percentage of the ligand to the second metal oxide is between 10% and 50% in case that the ligand is selected from the polyhydroxy ethers; and forming the metal oxide mixed solution by dissolving the doped metal oxide and the coordination metal compound in an alcohol and/or ether solvent.

In the method of manufacturing a light-emitting device according to an embodiment of the present disclosure, before the step of forming a coordination metal compound by adding a ligand to a second metal oxide, the method further includes:

doping the second metal oxide with ions selected from at least one of tin ions, selenium ions or sulfur ions, wherein a mole percentage of the ions to the second metal oxide is between 10% and 30% in case that the ions are selected from cationic tins, and a mole percentage of the ions to the second metal oxide is between 1% and 15% in case that the ions are selected from an anionic selenium or sulfur.

In the method of manufacturing a light-emitting device according to an embodiment of the present disclosure, before the step of coating a metal oxide mixed solution on the first device plate, the method further includes:

- forming a doped metal oxide by doping a first metal oxide with a metal element including at least one of magnesium and aluminum, and a mole percentage of the metal element to the first metal oxide being between 5% and 20%;

doping the second metal oxide with ions selected from at least one of tin ions, selenium ions or sulfur ions, wherein a mole percentage of the ions to the second metal oxide is between 10% and 30% in case that the ions are selected from cationic tins, and a mole percentage of the ions to the second metal oxide is between 1% and 15% in case that the ions are selected from anionic selenium or sulfur;

forming a coordination metal compound by adding a ligand to a second metal oxide, wherein the ligand is selected from the group consisting of thiols, alcohol amines, and polyhydroxy ethers, a mole percentage of the ligand to the second metal oxide is between 0.1% and 10% in case that the ligand is selected from the thiols or the alcohol amines, and a mole percentage of the ligand to the second metal oxide is between 10% and 50% in case that the ligand is selected from the polyhydroxy ethers; and forming the metal oxide mixed solution by dissolving the doped metal oxide and the coordination metal compound in an alcohol and/or ether solvent.

In the method of manufacturing a light-emitting device according to an embodiment of the present disclosure, before the step of coating a metal oxide mixed solution on the first device plate, the method further includes:

forming a doped coordination metal compound by doping a first metal oxide with a metal element and adding a ligand to the first metal oxide, wherein the metal element includes at least one of magnesium and aluminum, a mole percentage of the metal element to the first metal oxide is between 5% and 20%, the ligand is selected from the group consisting of thiols, alcohol amines, and polyhydroxy ethers, a mole percentage of the ligand to the second metal oxide is between 0.1% and 10% in case that the ligand is selected from the thiols or the alcohol amines, and a mole percentage of the ligand to the second metal oxide is between 10% and 50% in case that the ligand is selected from the polyhydroxy ethers;

providing a second metal oxide; and forming the metal oxide mixed solution by dissolving the doped metal oxide and the coordination metal compound in an alcohol and/or ether solvent.

In the method of manufacturing a light-emitting device according to an embodiment of the present disclosure, after the step of providing the second metal oxide, the method further includes:

forming an ion-doped metal oxide by doping the second metal oxide with ions selected from at least one of tin ions, selenium ions or sulfur ions, wherein a mole percentage of the ions to the second metal oxide is between 10% and 30% in case that the ion is selected from a cationic tin, and a mole percentage of the ions to the second metal oxide is between 1% and 15% in case that the ion is selected from an anionic selenium or sulfur.

In the method of manufacturing a light-emitting device according to an embodiment of the present disclosure, before the step of coating a metal oxide mixed solution on the first device plate, the method further includes:

forming a doped coordination metal compound by doping a first metal oxide with a metal element and adding a ligand to the first metal oxide, the metal element including at least one of magnesium and aluminum, a mole percentage of the metal element to the first metal oxide being between 5% and 20%, the ligand being selected from the group consisting of thiols, alcohol amines, and polyhydroxy ethers, a mole percentage of the ligand to the second metal oxide being between 0.1% and 10% in case that the ligand is selected from the thiols or the alcohol amines, and a mole percentage of the ligand to the second metal oxide being between 10% and 50% in case that the ligand is selected from the polyhydroxy ethers;

providing a second metal oxide;

forming an ion-doped metal oxide by doping the second metal oxide with ions selected from at least one of tin ions, selenium ions or sulfur ions, wherein a mole percentage of the ion to the second metal oxide is between 10% and 30% in case that the ion is selected from a cationic tin, and a mole percentage of the ion to the second metal oxide is between 1% and 15% in case that the ion is selected from an anionic selenium or sulfur; and forming the metal oxide mixed solution by dissolving the doped metal oxide and the coordination metal compound in an alcohol and/or ether solvent.

In the method of manufacturing a light-emitting device according to an embodiment of the present disclosure, the first metal oxide is selected from at least one of ZnO, $TiO_2$, $Fe_2O_3$, $SnO_2$, $Ta_2O_3$, AlZnO, ZnSnO, and InSnO, and the second metal oxide is selected from at least one of ZnO, $TiO_2$, $Fe_2O_3$, $SnO_2$, $Ta_2O_3$, AlZnO, ZnSnO, and InSnO.

In the method of manufacturing a light-emitting device according to an embodiment of the present disclosure, a value of the first preset temperature is between 40 degrees Celsius and 70 degrees Celsius, and a value of the second preset temperature is between 75 degrees Celsius and 130 degrees Celsius.

In the method of manufacturing a light-emitting device according to an embodiment of the present disclosure, the first device plate is a quantum dot light-emitting layer and the second device plate is a cathode.

In the method of manufacturing a light-emitting device according to an embodiment of the present disclosure, before the step of providing a first device plate, the method further includes:

forming a stacked structure by sequentially disposing an anode, a hole injection layer, and a hole transport layer, wherein the first device plate is disposing on one side of the hole transport layer away from the hole injection layer.

In the method of manufacturing a light-emitting device according to an embodiment of the present disclosure, the first device plate is a cathode, and the second device plate is a quantum dot light-emitting layer.

In the method of manufacturing a light-emitting device according to an embodiment of the present disclosure, after the step of forming a second device plate on one side of the second electron transport layer away from the first electron transport layer, the method further includes:

sequentially forming a hole transport layer, a hole injection layer, and an anode are on the second device plate.

In the method of manufacturing a light-emitting device according to an embodiment of the present disclosure, a material of the first electron transport layer is a metal oxide doped with a metal element, the metal oxide is selected from at least one of ZnO, $TiO_2$, $Fe_2O_3$, $SnO_2$, $Ta_2O_3$, AlZnO, ZnSnO, and InSnO, and the metal element is selected from magnesium or aluminum.

In the method of manufacturing a light-emitting device according to an embodiment of the present disclosure, a material of the second electron transport layer may be a coordination metal compound formed by coordinating a long-chain ligand with a metal oxide, and the long-chain ligand is selected from thiols, alcohol amines, or polyhydroxy ether compounds.

In the method of manufacturing a light-emitting device according to an embodiment of the present disclosure, the thiols, the alcohol amines, or the polyhydroxy ether compounds include ethanolamine, butanethiol, or triethylene glycol.

In the method of manufacturing a light-emitting device according to an embodiment of the present disclosure, a material of the second electron transport layer is an ion-doped coordination metal compound formed by doping ions with a metal oxide and then coordinating with a long-chain ligand selected from thiols, alcohol amines, or polyhydroxy ether compounds.

In the method of manufacturing a light-emitting device according to an embodiment of the present disclosure, ion dopants are selected from at least one of tin ions, selenium ions, and sulfur ions.

An embodiment of the present disclosure further provides a light-emitting device, wherein the light-emitting device is manufactured by the above method of manufacturing a light-emitting device.

An embodiment of the present disclosure further provides a display panel including the above light-emitting device, and the light-emitting device is disposed on an array substrate.

Advantageous Effects of Invention

Advantageous Effects

The present disclosure adopts a multi-stage annealing process to form a electron transport layer, which solves the problem of cumbersome manufacturing steps of an electron transport layer in the light-emitting device.

BRIEF DESCRIPTION OF THE DRAWINGS

Description of the Drawings

FIG. 1 is a schematic structural diagram of a light-emitting device according to an embodiment of the present disclosure.

FIG. 2 is a schematic structural diagram of another light-emitting device according to an embodiment of the present disclosure;

FIG. 3 is a flowchart showing steps of a method of manufacturing a light-emitting device according to an embodiment of the present disclosure;

FIGS. 4 to 9 are schematic diagrams of a method of manufacturing a light-emitting device according to an embodiment of the present disclosure.

Figure 9:
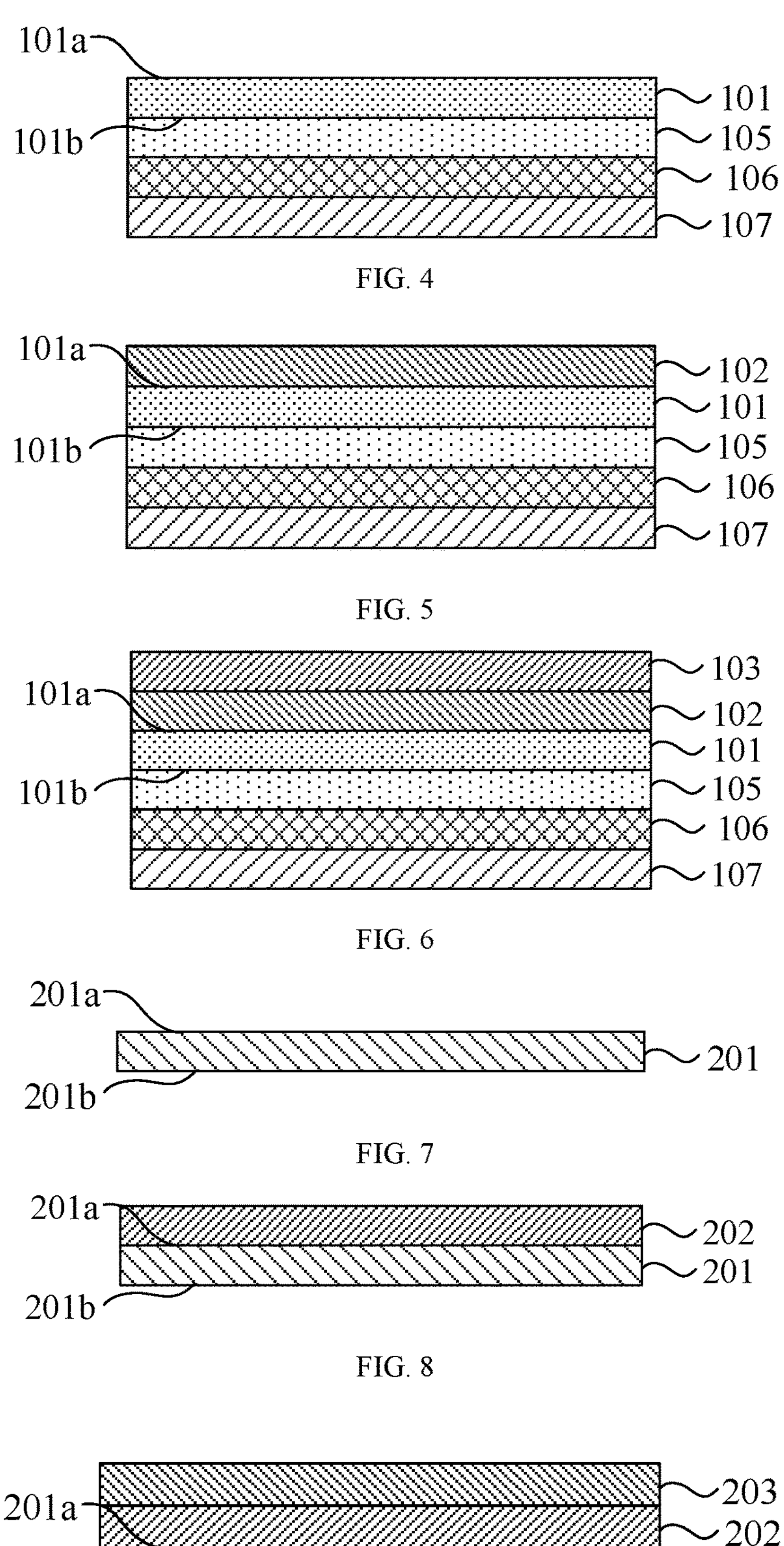
Figure 10:
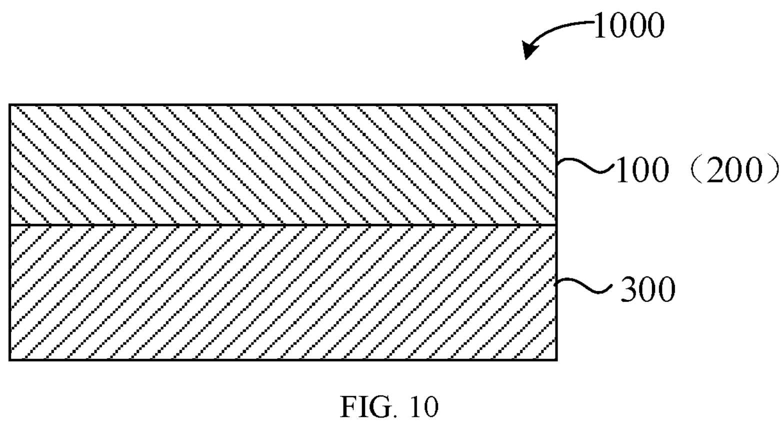

FIG. 10 is a schematic structural diagram of a display panel according to an embodiment of the present disclosure.

EXAMPLES OF INVENTION

Embodiments of the Present Invention

In order to make the purpose, technical solutions and advantages of the present disclosure more clear, hereinafter, technical solutions in embodiments of the present disclosure will be clearly and completely described with reference to the accompanying drawings in embodiments of the present disclosure. Apparently, the described embodiments are only some embodiments of the present disclosure, but not all the embodiments of the present disclosure. All other embodiments that can be obtained by a person with ordinary skill in the art based on the embodiments in the present disclosure without creative labor belong to the protection scope of the present disclosure. In addition, it should be understood that the specific embodiments described herein are only used to illustrate and explain the present disclosure, and are not intended to limit the present disclosure. In the present disclosure, unless otherwise stated, directional words such as "up" and "down" usually refer to the up and down in the actual use or working state of a device, specifically the drawing direction in the drawings; while "inside" and "outside" refer to the outline of the device.

An embodiment of the present disclosure provides a light-emitting device and a manufacturing method thereof, and a display panel, which are described in detail below. It should be noted that the description order of the following embodiments is not taken as a limitation to the preferred order of the embodiments.

Referring to FIG. 1, which is a schematic structural diagram of a light-emitting device according to an embodiment of the present disclosure. An embodiment of the present disclosure provides a light-emitting device 100 including a first device plate 101, a first electron transport layer 102, a second electron transport layer 103, and a second device plate 104. In this embodiment, the first device plate is a quantum dot light-emitting layer, and the second device plate 104 is a cathode.

Specifically, in some embodiments, the light-emitting device 100 may also include an anode 107, a hole injection layer 106, and a hole transport layer 105.

The anode 107, the hole injection layer 106, and the hole transport layer 105 are sequentially stacked. The first device plate 101 has a first side 101*a* and a second side 101*b* that are oppositely disposed. The second side 101*b* of the first device plate 101 is attached to the hole transport layer 105. The first electron transport layer 102 is disposed on the first side 101*a*. The second electron transport layer 103 is disposed on one side of the first electron transport layer 102 away from the first device plate 101. The second device plate 104 is disposed on one side of the second electron transport layer 103 away from the first electron transport layer 102. The first device plate 101 is a quantum dot light-emitting layer and the second device plate 104 is a cathode.

In an embodiment, the anode 107 may adopt a transparent conductive oxide or a conductive polymer. The transparent conductive oxide may be indium tin oxide (ITO), fluorine-doped $SnO_2$ conductive glass ($SnO_2$:F), or the like.

The hole injection layer 106 may be a conductive polymer such as PEDOT: PSS; a N-type semiconductor with a high work function such as HAT-CN, $MoO_3$, $WO_3$, $V_2O_5$, $Rb_2O$, or the like.

The hole transport layer 105 may be an organic hole transport layer such as Poly-TPD, TFB, PVK, TCTA, CBP, NPB, NPD, or the like; or an inorganic hole transport layer such as NiO, $Cu_2O$, CuSCN, or the like.

The first device plate 101 is a quantum dot light-emitting layer, wherein the quantum dot may be a II-VI-group compound semiconductor such as CdSe, ZnCdS, CdSeS, ZnCdSeS, CdSe/ZnS, CdSeS/ZnS, CdSe/CdS, CdSe/CdS/ZnS, ZnCdS/ZnS, CdS/ZnS, ZnCdSeS/ZnS, or the like; may be a III-V-group compound semiconductor such as InP, InP/ZnS, or the like; may be a I-III-VI-group compound semiconductor such as CuInS, AgInS, CuInS/ZnS, AnInS/ZnS, or the like; may be a IV-group elemental semiconductor such as Si, C, Graphene, or the like; or may be a perovskite quantum dot such as $CsPbM_3$ (M=Cl, Br, I), or the like.

The first electron transport layer 102 is disposed on the first side 101*a* of the first device plate 101. In some embodiments, a material of the first electron transport layer 102 may be a metal oxide doped with a metal element, wherein the metal oxide may be selected from at least one of ZnO, $TiO_2$, $Fe_2O_3$, $SnO_2$, $Ta_2O_3$, AlZnO, ZnSnO, and InSnO, and the metal element is selected from an active metal such as magnesium or aluminum.

A second electron transport layer 103 is disposed on one side of the first electron transport layer 102 away from the first device plate 101. In some embodiments, the material of the second electron transport layer 103 may be a coordination metal compound. Specifically, the coordination metal compound is formed by coordinating a long-chain ligand with a metal oxide. The long-chain ligand may be selected from selected from thiols, alcohol amines, or polyhydroxy ether compounds, for example, ethanolamine, butanethiol, or triethylene glycol, and the like. The metal oxide is selected from at least one of ZnO, $TiO_2$, $Fe_2O_3$, $SnO_2$, $Ta_2O_3$, AlZnO, ZnSnO, and InSnO.

In some embodiments, the material of the second electron transport layer 103 may also be an ion-doped coordination metal compound, and the ion-doped coordination metal compound is formed by doping ions with a metal oxide and then coordinating with a long-chain ligand. The long-chain ligand may be selected from thiols, alcohol amines, or polyhydroxy ether compounds, for example, ethanolamine, butanethiol, or triethylene glycol, and the like. The metal oxide is selected from at least one of ZnO, $TiO_2$, $Fe_2O_3$, $SnO_2$, $Ta_2O_3$, AlZnO, ZnSnO, and InSnO. The ion dopant may be selected from at least one of tin ions, selenium ions, and sulfur ions.

The second device plate 104 is disposed on one side of the second electron transport layer 103 away from the first electron transport layer 102. The second device plate 104 is a cathode, and the material of the second device plate 104 may be a metal such as aluminum, magnesium, silver, or the like.

Referring to FIG. 2, which is a schematic structural diagram of another light-emitting device according to an embodiment of the present disclosure. The light-emitting device 200 includes a first device plate 201, a first electron transport layer 202, a second electron transport layer 203, and a second device plate 204.

In some embodiments, the light-emitting device 200 further includes a hole transport layer 205, a hole injection layer 206, and an anode 207.

Specifically, the first device plate 201 has a first side 201*a* and a second side 201*b* that are oppositely disposed. The first electron transport layer 202 is disposed on the first side 201*a*. The second electron transport layer 203 is disposed on one side of the first electron transport layer 202 away from the first device plate 201. The second device plate 204 is disposed on one side of the second electron transport layer 203 away from the first electron transport layer 202. The hole transport layer 205, the hole injection layer 206, and the anode 207 are sequentially stacked on the second device plate 204. In this embodiment, the first device plate 201 is a cathode, and the second device plate 204 is a quantum dot light-emitting layer.

In some embodiments, the material of the first electron transport layer 202 is a doped coordination metal compound. The doped coordination metal compound is formed by doping a metal element with a metal oxide, and followed by coordinating the doped metal oxide with a long chain ligand. The metal element includes at least one of magnesium and aluminum. The long-chain ligand may be selected from thiols, alcohol amines, or polyhydroxy ether compounds, for example, ethanolamine, butanethiol, or triethylene glycol, and the like. The metal oxide is selected from at least one of ZnO, $TiO_2$, $Fe_2O_3$, $SnO_2$, $Ta_2O_3$, AlZnO, ZnSnO, and InSnO.

The material of the second electron transport layer 203 may be a metal oxide or an ion-doped metal oxide. The metal oxide is selected from at least one of ZnO, $TiO_2$, $Fe_2O_3$, $SnO_2$, $Ta_2O_3$, AlZnO, ZnSnO, and InSnO. The ion dopant may be selected from tin ions, selenium ions, sulfur ions, or the like.

The light-emitting device 200 in this embodiment differs from the light-emitting device 100 in the previous embodiment in that:

The first device plate 101 of the light-emitting device 100 is a quantum dot light-emitting layer, the second device plate 104 is a cathode, the first device plate 201 of the light-emitting device 200 is a cathode, and the second device plate 204 is a quantum dot light-emitting layer. It should be understood that the light-emitting device 200 in this embodiment is an inverted structure of the light-emitting device 100 in the previous embodiment.

Next, a method of manufacturing a light-emitting device will be described in embodiments of the present disclosure.

Referring to FIGS. 1, 3, 4, 5, and 6, a method of manufacturing the light-emitting device 100 includes steps as follows:

Step B1: providing a first device plate 101. The first device plate 101 has a first side 101*a* and a second side 101*b* that that are oppositely disposed, please refer to FIG. 4.

In this embodiment, the first device plate 101 is a quantum dot light-emitting layer.

In some embodiments, before the step of providing the first device plate 101, the method further includes forming a stacked structure by sequentially disposing an anode 107, a hole injection layer 106, and a hole transport layer 105. The first device plate 101 is disposed on one side of the hole transport layer 105 away from the hole injection layer 106.

Step B2: coating a metal oxide mixed solution on the first device plate 101.

In some embodiments, before the step B2, the method further includes:

Forming a doped metal oxide by doping a first metal oxide with a metal element. The metal element includes at least one of magnesium and aluminum. A mole percentage of the metal element to the first metal oxide is between 5% and 20%.

Specifically, the first metal oxide is doped with a metal element such as magnesium or aluminum, which is used to improve the conduction band of the first metal oxide, so that the conduction band bottom energy level of the quantum dot light-emitting layer is matched with that of the doped metal oxide, thereby reducing the potential barrier between the doped metal oxide and the quantum dot light-emitting layer, which is beneficial to electron transport.

In some embodiments, the mole percentage of a metal element such as magnesium or aluminum to the first metal oxide can be any one of 5%, 7%, 10%, 12%, 15%, 18%, or 20%. In this embodiment, the mole percentage of the metal element to the first metal oxide is between 5% and 20%. On the one hand, the doping ratio of the metal element is ensured, and the conduction band bottom energy level of the metal oxide is improved, so that the conduction band bottom energy level of the quantum dot light-emitting layer is matched with that of the doped metal oxide. On the other hand, the metal element such as magnesium or aluminum is dissolved in a solvent to form an intrinsic hydroxyl ligand. The hydroxyl ligand of the first metal oxide has a small steric hindrance and is easy to agglomerate and deposit under heating conditions, wherein the agglomeration temperature of the doped metal oxide is less than 60 degrees Celsius.

In some embodiments, the first metal oxide is selected from at least one of ZnO, $TiO_2$, $Fe_2O_3$, $SnO_2$, $Ta_2O_3$, AlZnO, ZnSnO, and InSnO.

The second metal oxides are doped with ions selected from at least one of tin ions, selenium ions or sulfur ions. When the ion is selected from cationic tin, the mole percentage of the ion to the second metal oxide is between 10% and 30%. Since the doping ability of the tin ions with second metal oxides with is weak, the mole percentage of the tin ion to the second metal oxide in this embodiment is between 10% and 30%. For example, the mole percentage of the tin ion to the second metal oxide may be any one of 10%, 13%, 18%, 23%, 28%, 30%. When the mole percentage of the tin ion and the second metal oxide is between 10% and 30%, the conduction band bottom energy level of the formed ion-doped metal oxide decreases, so that it matches with the conduction band bottom energy level of the cathode, which is beneficial to electron transport. When the ion is selected from anionic selenium or sulfur, the mole percentage of the ion to the second metal oxide is between 1% and 15%. Since the doping ability of selenium ion or sulfur ion with the second metal oxide is strong, the mole percentage of the selenium ion or sulfur ion to the second metal oxide in this embodiment is between 1% and 15%. For example, the mole percentage of the tin ion to the second metal oxide may be any one of 1%, 5%, 8%, 13%, 15%. Wen the mole percentage of the selenium ion or sulfur ion to the second metal oxide is between 1% and 15%, the conduction band bottom energy level of the formed ion-doped metal oxide is reduced, so as to match with the conduction band bottom energy level of the cathode, which is beneficial to electron transport.

Specifically, the second metal oxide is doped with at least one of tin ion, selenium ion, or sulfur ion to reduce the conduction band of the second metal oxide.

A ligand is added to the second metal oxide to form a coordination metal compound. The ligand is selected from the group consisting of thiols, alcohol amines, and polyhydroxy ethers. When the ligand is selected from thiols or alcohol amines, the mole percentage of ligand to the second metal oxide is between 0.1% and 10%. When the ligand is selected from polyhydroxy ethers, the mole percentage of ligand to the second metal oxide is between 10% and 50%.

In an embodiment, since the coordination ability of thiol ligands or alcohol amine ligands with the second metal oxide is weak, the mole percentage of thiols or alcohol amines to the second metal oxide is between 0.1% and 10%. For example, the mole percentage of thiols or alcohol amines to the second metal oxide is any one of 0.1%, 1%, 3%, 5%, 8%, 10%. The mole percentage of thiols or alcohol amines to the second metal oxide is between 0.1% and 10%, which effectively increases the steric hindrance of the second metal oxide, thereby enhancing the thermal stability of the coordination metal oxide.

Similarly, since the coordination ability of polyhydroxy ether ligand with the second metal oxide is weak, the mole percentage of the polyhydroxy ether ligand to the second metal oxide is between 10% and 50%. For example, the mole percentage of the polyhydroxy ether-based ligand to the second metal oxide is any one of 10%, 15%, 30%, 45%, 50%. The mole percentage of the polyhydroxy ether-based ligand to the second metal oxide is between 10% and 50%, which effectively increases the steric hindrance of the second metal oxide, thereby enhancing the thermal stability of the coordinated metal oxide.

In an embodiment, the second metal oxide is selected from at least one of ZnO, $TiO_2$, $Fe_2O_3$, $SnO_2$, $Ta_2O_3$, AlZnO, ZnSnO, and InSnO.

Specifically, thiol ligands, alcohol amine ligands, or polyhydroxy ether ligands, such as ethanolamine, butanethiol, or triethylene glycol, are added to the second metal oxide, so that the second metal oxide is coordinated with it to form a coordination metal compound, which increases the steric hindrance of the second metal oxide and improves the thermal stability of the second metal oxide. The heat-resistant temperature of the coordination metal oxide is greater than 60 degrees Celsius.

The doped metal oxide and the coordination metal compound are dissolved in an alcohol and/or ether solvent to form a metal oxide mixed solution. The alcohol solvent and the ether solvent have a boiling point greater than 80 degrees Celsius.

Step B3: performing a first annealing treatment on the metal oxide mixed solution at a first preset temperature to form a first electron transport layer 102, referring to FIG. 5.

Specifically, the metal oxide mixed solution is subjected to a first annealing treatment at a first preset temperature, so that the doped metal oxide is agglomerated on the first side 101*a* to form the first electron transport layer 102. The first preset temperature is greater than the thermal stability temperature of the doped metal oxide. In an embodiment, the value of the first preset temperature is between 40 and 70 degrees Celsius, and the annealing time is between 5minutes and 40 minutes. When the metal oxide mixed solution is subjected to annealing at a temperature between 40 degrees Celsius and 70 degrees Celsius, the doped metal oxides with poor thermal stability in the metal oxide mixed solution are preferentially agglomerated and deposited on the first side 101*a* of the first device plate 101 to form the first electron transport layer 102.

Step B4: performing a second annealing treatment on the metal oxide mixed solution at a second preset temperature to form a second electron transport layer 103. The second electron transport layer is disposed on one side of the first electron transport layer 102 away from the first device plate 101. The second preset temperature is greater than the first preset temperature, please refer to FIG. 6.

Specifically, the metal oxide mixed solution is subjected to a second annealing treatment at a second preset temperature, so that the coordination metal oxide or the ion-doped coordination metal compounds are aggregated on one side of the first electron transport layer 102 away from the first device plate 101 to form the second electron transport layer 103. In an embodiment, the value of the second preset temperature is between 75 degrees Celsius and 130 degrees Celsius, and the annealing time is between 5 minutes and 70 minutes. When the metal oxide mixed solution is subjected to annealing at a temperature of between 75 degrees Celsius and 130 degrees Celsius, the coordination metal oxides or the ion-doped coordination metal compounds with strong thermal stability in the metal oxide mixed solution are agglomerated and deposited on the first electron transport layer 102 to form the second electron transport layer 103.

It should be understood that in this embodiment, after the first annealing treatment, the heating device can be continuously heated, and then the second annealing treatment may be performed.

In an embodiment, the annealing treatment may be performed in a negative pressure environment or a normal pressure environment. The advantages of performing annealing treatment under a negative pressure are that the solvent volatilizes more thoroughly, and the first electron transport layer 102 and the second electron transport layer 103 formed by deposition are more uniform, which increases the stability of the first electron transport layer 102 and the second electron transport layer 103.

Step B5: forming a second device plate 104 on one side of the second electron transport layer 103 away from the first electron transport layer 102, referring to FIG. 1.

The second device plate 104 is a cathode.

In the method of manufacturing a light-emitting device according to embodiments of the present disclosure, a metal oxide mixed solution is coated on a quantum dot light-emitting layer. Since the agglomeration temperatures of the doped metal oxides and the coordination metal compounds in the metal oxide mixed solution are different, multi-stage annealing process can be used to anneal the metal oxide mixed solution, thus forming the first electron transport layer and the second electron transport layer at different annealing temperatures. Compared with the prior art, the method of manufacturing a light-emitting device in this embodiment solves the problem of cumbersome manufacturing steps of an electron transport layer in the light-emitting device.

In addition, since the difference in the conduction band bottom energy levels between the doped metal oxides and the quantum dot light-emitting layer is between 0.1 eV and 0.5 eV, the conduction band bottom energy level of the quantum dot light-emitting layer is matched with that of the doped metal oxide, thereby reducing the potential barrier between the doped metal oxides and the quantum dot light-emitting layer. The difference in the conduction band bottom energy levels between the coordination metal compounds and the cathode is between 0.2 eV and 0.4 eV, which reduces the potential barrier between the coordination metal compounds and the cathode, facilitates the transport of electrons from the cathode to the quantum dot light-emitting layer, and improves the light-emitting efficiency of the light-emitting device.

Referring to FIGS. 2, 3, 7, 8, and 9, a method of manufacturing the light-emitting device 200 includes steps as follows:

Step B1: providing a first device plate 201. The first device plate 201 has a first side 201*a* and a second side 201*b* that that are oppositely disposed.

In this embodiment, the first device plate 201 is a cathode.

Step B2: coating a metal oxide mixed solution on the first side 201*a*.

In some embodiments, prior to step B2, the method further includes:

Forming a doped coordination metal compound by doping a first metal oxide with a metal element and adding a ligand to the first metal oxide. The metal element includes at least one of magnesium and aluminum. A mole percentage of the metal element to the first metal oxide is between 5% and 20%. The ligand is selected from the group consisting of thiols, alcohol amines, and polyhydroxy ethers. A mole percentage of the ligand to the second metal oxide is between 0.1% and 10% in case that the ligand is selected from the thiols or the alcohol amines, and a mole percentage of the ligand to the second metal oxide is between 10% and 50% in case that the ligand is selected from the polyhydroxy ethers.

Specifically, the first metal oxide is doped with a metal element such as magnesium or aluminum, and ligands are added to the first metal oxide, so that the formed doped metal compound is coordinated with ligands like thiols, alcohol amines, and polyhydroxy ethers to form a doped coordinated metal oxide, the conduction band of the first metal oxide is improved, the conduction band bottom energy level of the quantum dot light-emitting layer is matched with that of the doped coordinated metal compound, the potential barrier between the doped coordinated metal compound and the quantum dot light-emitting layer is reduced, and electron transport is facilitated.

In some embodiments, the mole percentage of metals such as magnesium or aluminum to the first metal oxide can be any one of 5%, 7%, 10%, 12%, 15%, 18%, or 20%. In this embodiment, the mole percentage of the metal element to the first metal oxide is between 5% and 20%, thereby ensuring the doping ratio of the metal element, improving the conduction band bottom energy level of the metal oxides, and enabling the conduction band bottom energy level of the quantum dot light-emitting layer to match with that of the doped coordination metal compound.

In addition, by adding long-chain ligands to the doped metal oxides, the steric hindrance of the second metal oxides is increased, the thermal stability of the first metal oxide is improved, and the heat-resistant temperature of the doped coordination metal compounds is greater than 60 degrees Celsius.

In some embodiments, the first metal oxide is selected from at least one of ZnO, $TiO_2$, $Fe_2O_3$, $SnO_2$, $Ta_2O_3$, AlZnO, ZnSnO, and InSnO.

A second metal oxide is provided. In some embodiments, after the step of providing the second metal oxide, the method may further include: doping the second metal oxide with ions selected from at least one of tin ions, selenium ions, or sulfur ions. The mole percentage of the ion to the second metal oxide being between 10% and 30% when the ion is selected from cationic tin, and the mole percentage of the ion to the second metal oxide is between 1% and 15% when the ion is selected from anionic selenium or sulfur.

Specifically, the second metal oxide is doped with at least one of tin ions, selenium ions, or sulfur ions to reduce the conduction band of the second metal oxides, so that the conduction band bottom energy level of the second metal oxides is matched with that of the cathode.

In an embodiment, the second metal oxide is selected from at least one of ZnO, $TiO_2$, $Fe_2O_3$, $SnO_2$, $Ta_2O_3$, AlZnO, ZnSnO, and InSnO.

The doped coordination metal compound and the second metal oxide or the ion-doped metal oxide are dissolved in an alcohol and/or ether solvent to form a metal oxide mixed solution.

Step B3: performing a first annealing treatment on the metal oxide mixed solution at a first preset temperature to form a first electron transport layer 202. The first electron transport layer 202 is located on the first side 101*a*.

Specifically, the metal oxide mixed solution is subjected to a first annealing treatment at a first preset temperature, so that the second metal oxides or the ion-doped metal oxides are deposited on the first side 201*a* to form the first electron transport layer 202. The first preset temperature is greater than thermal stability temperature of the second metal oxides or the ion-doped metal oxides. In an embodiment, the value of the first preset temperature is between 40 degrees Celsius and 70 degrees Celsius, and the annealing time is between 5 minutes and 40 minutes. When the the metal oxide mixed solution is subjected to annealing at a temperature between 40 degrees Celsius and 70 degrees Celsius, the second metal oxides or the ion-doped metal oxides with poor thermal stability in the metal oxide mixed solution are preferentially agglomerated and deposited the first side 201*a* of the first device plate 201 to form the first electron transport layer 202.

Step B4: performing a second annealing treatment on the metal oxide mixed solution at a second preset temperature to form a second electron transport layer 203. The second electron transport layer 203 is disposed on one side of the first electron transport layer 202 away from the first device plate 201. The second preset temperature is greater than the first preset temperature.

Specifically, the metal oxide mixed solution is subjected to a second annealing treatment at a second preset temperature, so that the doped coordination metal compounds are aggregated on one side of the first electron transport layer 202 away from the first device plate 201 to form the second electron transport layer 203. In an embodiment, the value of the second preset temperature is between 75 degrees Celsius and 130 degrees Celsius, and the annealing time is between 5 minutes and 70 minutes. When the metal oxide mixed solution is subjected to annealing at a temperature of between 75 degrees Celsius and 130 degrees Celsius, the doped coordination metal compounds with strong thermal stability in the metal oxide mixed solution are agglomerated and deposited on the first electron transport layer 202 to form the second electron transport layer 203.

In an embodiment, the annealing treatment may be performed in a negative pressure environment or a normal pressure environment. The advantages of performing annealing treatment under a negative pressure are that the solvent volatilizes more thoroughly, and the first electron transport layer 202 and the second electron transport layer 203 formed by the deposition are more uniform, which increases the stability of the first electron transport layer 202 and the second electron transport layer 203.

Step B5: forming a second device plate 204 on one side of the second electron transport layer 203 away from the first electron transport layer 202.

The second device plate 204 is a quantum dot light-emitting layer.

In some embodiments, after the step B5, the method may further includes forming a hole transport layer 205, a hole injection layer 206, and an anode 207 sequentially on the second device plate 204.

In the method of manufacturing a light-emitting device according to embodiments of the present disclosure, the metal oxide mixed solution is coated on a cathode. Since the agglomeration temperatures of the doped coordination metal compounds and the ion-doped metal oxides included in the metal oxide mixed solution are different, multi-stage annealing process can be used to anneal the metal oxide mixed solution, thus forming the first electron transport layer and the second electron transport layer at different annealing temperatures, which solves the problem of cumbersome manufacturing steps of an electron transport layer in the light-emitting device.

Further, since the difference in the conduction band bottom energy levels between the doped coordination metal compounds and the quantum dot light-emitting layer is between 0.1 eV and 0.5 eV, the conduction band bottom energy level of the quantum dot light-emitting layer is matched with that of the doped coordination metal compounds, thereby reducing the potential barrier between the doped coordination metal compounds and the quantum dot light-emitting layer. The difference in the conduction band bottom energy levels between the ion-doped metal oxides or the second metal oxides and the cathode is between 0.2 eV and 0.4 eV, which reduces the potential barrier the ion-doped metal oxides or the second metal oxides and the cathode, facilitates the transport of electrons from the cathode to the quantum dot light-emitting layer, and improves the light-emitting efficiency of the light-emitting device.

Referring to FIG. 10, embodiments of the present disclosure further provide a display panel. The display panel 1000 includes an array substrate 300 and a light-emitting device 100 or a light-emitting device 200 disposed on the array substrate 300.

The light-emitting device 100 and the light-emitting device 200 are manufactured by the above method of manufacturing the light-emitting device.

Embodiments of the present disclosure provides a light-emitting device and a manufacturing method thereof, and a display panel. In the method of manufacturing the light-emitting device provided in embodiments of the present disclosure, multi-stage annealing process is used to form an electron transport layer, thereby solving the problem of cumbersome manufacturing steps of an electron transport layer in the light-emitting device.

In view of above, although the present disclosure has been disclosed by way of example, the foregoing embodiments are not intended to limit the present disclosure. Those ordinarily skilled in the art may make various changes and modifications without departing from the spirit and scope of the present disclosure, and therefore, the protection scope of the present disclosure shall be subject to the scope defined by the claims.

What is claimed is:

1. A method of manufacturing a light-emitting device comprising:

providing a first device plate;

coating a metal oxide mixed solution on the first device plate;

performing a first annealing treatment on the metal oxide mixed solution at a first preset temperature to form a first electron transport layer;

performing a second annealing treatment on the metal oxide mixed solution at a second preset temperature to form a second electron transport layer, the second electron transport layer being disposed on one side of the first electron transport layer away from the first device plate, and the second preset temperature being greater than the first preset temperature; and forming a second device plate on one side of the second electron transport layer away from the first electron transport layer.

2. The method according to claim 1, wherein before the step of coating a metal oxide mixed solution on the first device plate, the method further comprises:

forming a doped metal oxide by doping a first metal oxide with a metal element comprising at least one of magnesium and aluminum, a mole percentage of the metal element to the first metal oxide being between 5% and 20%;

forming a coordination metal compound by adding a ligand to a second metal oxide, the ligand being selected from the group consisting of thiols, alcohol amines, and polyhydroxy ethers, a mole percentage of the ligand to the second metal oxide being between 0.1% and 10% in case that the ligand is selected from the thiols or the alcohol amines, and a mole percentage of the ligand to the second metal oxide being between 10% and 50% in case that the ligand is selected from the polyhydroxy ethers; and forming the metal oxide mixed solution by dissolving the doped metal oxide and the coordination metal compound in an alcohol and/or ether solvent.

3. The method according to claim 2, wherein before the step of forming a coordination metal compound by adding a ligand to a second metal oxide, the method further comprises:

doping the second metal oxide with an ion selected from at least one of a tin ion, a selenium ion or a sulfur ion, a mole percentage of the ion to the second metal oxide being between 10% and 30% in case that the ion is selected from a cationic tin, and a mole percentage of the ion to the second metal oxide being between 1% and 15% in case that the ion is selected from an anionic selenium or anionic sulfur.

4. The method according to claim 1, wherein before the step of coating a metal oxide mixed solution on the first device plate, the method further comprises:

forming a doped metal oxide by doping a first metal oxide with a metal element comprising at least one of magnesium and aluminum, and a mole percentage of the metal element to the first metal oxide being between 5% and 20%;

doping the second metal oxide with an ion selected from at least one of a tin ion, a selenium ion or a sulfur ion, a mole percentage of the ion to the second metal oxide being between 10% and 30% in case that the ion is selected from a cationic tin, and a mole percentage of the ion to the second metal oxide being between 1% and 15% in case that the ion is selected from an anionic selenium or anionic sulfur;

forming a coordination metal compound by adding a ligand to a second metal oxide, the ligand being selected from the group consisting of thiols, alcohol amines, and polyhydroxy ethers, a mole percentage of the ligand to the second metal oxide being between 0.1% and 10% in case that the ligand is selected from the thiols or the alcohol amines, and a mole percentage of the ligand to the second metal oxide being between 10% and 50% in case that the ligand is selected from the polyhydroxy ethers; and forming the metal oxide mixed solution by dissolving the doped metal oxide and the coordination metal compound in an alcohol and/or ether solvent.

5. The method according to claim 1, wherein before the step of coating a metal oxide mixed solution on the first device plate, the method further comprises:

forming a doped coordination metal compound by doping a first metal oxide with a metal element and adding a ligand to the first metal oxide, the metal element comprising at least one of magnesium and aluminum, a mole percentage of the metal element to the first metal oxide being between 5% and 20%, the ligand being selected from the group consisting of thiols, alcohol amines, and polyhydroxy ethers, a mole percentage of the ligand to the second metal oxide being between 0.1% and 10% in case that the ligand is selected from the thiols or the alcohol amines, and a mole percentage of the ligand to the second metal oxide being between 10% and 50% in case that the ligand is selected from the polyhydroxy ethers;

providing a second metal oxide; and forming the metal oxide mixed solution by dissolving the doped metal oxide and the coordination metal compound in an alcohol and/or ether solvent.

6. The method according to claim 5, wherein after the step of providing the second metal oxide, the method further comprises:

forming an ion-doped metal oxide by doping the second metal oxide with an ion selected from at least one of a tin ion, a selenium ion or a sulfur ion, a mole percentage of the ion to the second metal oxide being between 10% and 30% in case that the ion is selected from a cationic tin, and a mole percentage of the ion to the second metal oxide being between 1% and 15% in case that the ion is selected from an anionic selenium or anionic sulfur.

7. The method according to claim 1, wherein before the step of coating a metal oxide mixed solution on the first device plate, the method further comprises:

forming a doped coordination metal compound by doping a first metal oxide with a metal element and adding a ligand to the first metal oxide, the metal element comprising at least one of magnesium and aluminum, a mole percentage of the metal element to the first metal oxide being between 5% and 20%, the ligand being selected from the group consisting of thiols, alcohol amines, and polyhydroxy ethers, a mole percentage of the ligand to the second metal oxide being between 0.1% and 10% in case that the ligand is selected from the thiols or the alcohol amines, and a mole percentage of the ligand to the second metal oxide being between 10% and 50% in case that the ligand is selected from the polyhydroxy ethers;

providing a second metal oxide;

forming an ion-doped metal oxide by doping the second metal oxide with an ion selected from at least one of a tin ion, a selenium ion or a sulfur ion, a mole percentage of the ion to the second metal oxide being between 10% and 30% in case that the ion is selected from a cationic tin, and a mole percentage of the ion to the second metal oxide being between 1% and 15% in case that the ion is selected from an anionic selenium or anionic sulfur; and forming the metal oxide mixed solution by dissolving the doped metal oxide and the coordination metal compound in an alcohol and/or ether solvent.

8. The method according to claim 2, wherein the first metal oxide is selected from at least one of ZnO, $TiO_2$, $Fe_2O_3$, $SnO_2$, $Ta_2O_3$, AlZnO, ZnSnO, and InSnO, and the second metal oxide is selected from at least one of ZnO, $TiO_2$, $Fe_2O_3$, $SnO_2$, $Ta_2O_3$, AlZnO, ZnSnO, and InSnO.

9. The method according to claim 1, wherein a value of the first preset temperature is between 40 degrees Celsius and 70 degrees Celsius, and a value of the second preset temperature is between 75 degrees Celsius and 130 degrees Celsius.

10. The method according to claim 1, wherein the first device plate is a quantum dot light-emitting layer and the second device plate is a cathode.

11. The method according to claim 10, wherein before the step of providing a first device plate, the method further comprises:

forming a stacked structure by sequentially disposing an anode, a hole injection layer, and a hole transport layer, and the first device plate being disposing on one side of the hole transport layer away from the hole injection layer.

12. The method according to claim 1, wherein the first device plate is a cathode, and the second device plate is a quantum dot light-emitting layer.

13. The method according to claim 12, wherein after the step of forming a second device plate on one side of the second electron transport layer away from the first electron transport layer, the method further comprises:

sequentially forming a hole transport layer, a hole injection layer, and an anode are on the second device plate.

14. The method according to claim 1, wherein a material of the first electron transport layer is a metal oxide doped with a metal element, the metal oxide is selected from at least one of ZnO, $TiO_2$, $Fe_2O_3$, $SnO_2$, $Ta_2O_3$, AlZnO, ZnSnO, and InSnO, and the metal element is selected from magnesium or aluminum.

15. The method according to claim 1, wherein a material of the second electron transport layer may be a coordination metal compound formed by coordinating a long-chain ligand with a metal oxide, and the long-chain ligand being selected from thiols, alcohol amines, or polyhydroxy ether compounds.

16. The method according to claim 15, wherein the thiols, the alcohol amines, or the polyhydroxy ether compounds comprise ethanolamine, butanethiol, or triethylene glycol.

17. The method according to claim 1, wherein a material of the second electron transport layer is an ion-doped coordination metal compound formed by doping an ion with a metal oxide and then coordinating with a long-chain ligand selected from thiols, alcohol amines, or polyhydroxy ether compounds.

18. The method according to claim 17, wherein an ion dopant is selected from at least one of a tin ion, a selenium ion, and a sulfur ion.

* * * * *